United States Patent [19]

Tregilgas

[11] Patent Number: 4,588,446
[45] Date of Patent: May 13, 1986

[54] METHOD FOR PRODUCING GRADED BAND GAP MERCURY CADMIUM TELLURIDE

[75] Inventor: John H. Tregilgas, Richardson, Tex.

[73] Assignee: Texas Instruments Incorporated, Dallas, Tex.

[21] Appl. No.: 703,799

[22] Filed: Feb. 21, 1985

[51] Int. Cl.$^4$ .......................................... H01L 21/385
[52] U.S. Cl. ..................................... 148/1.5; 29/572; 148/188; 148/191; 148/DIG. 64; 156/614; 156/DIG. 72
[58] Field of Search ................. 148/1.5, 174, 175, 188, 148/191; 156/614, DIG. 72; 29/572; 252/62, 32 T

[56] References Cited

U.S. PATENT DOCUMENTS

| | | | |
|---|---|---|---|
| 3,849,205 | 11/1974 | Brau et al. ..................... | 148/171 X |
| 4,374,678 | 2/1983 | Castro .............................. | 148/1.5 |
| 4,376,659 | 3/1983 | Castro .............................. | 148/174 X |
| 4,435,224 | 3/1984 | Durand ........................... | 148/175 X |
| 4,439,267 | 3/1984 | Jackson ......................... | 156/DIG. 72 |
| 4,465,527 | 8/1984 | Nishizawa ........................ | 148/171 |

Primary Examiner—George T. Ozaki
Attorney, Agent, or Firm—Carlton H. Hoel; James O. Groover; James T. Comfort

[57] ABSTRACT

The disclosure relates to a method for producing graded band gap mercury cadmium telluride, preferably in narrow band gap mercury cadmium telluride, to reduce tunneling and the like by causing the surface region of the mercury cadmium telluride to lose mercury or by replacing the mercury with another group IIB element, such as cadmium or zinc. Cadmium or zinc films are deposited on the surface of a mercury cadmium telluride substrate and the substrate is then subjected to a low temperature anneal to replace the mercury at the substrate surface on a graded basis. In the case of a P-type mercury cadmium telluride substrate, the film can be that of a group I metal such as gold, silver or copper. Low temperature annealling is again used. The deposited film can be selectively disposed on the substrate to provide localized regions with graded band gas in the mercury cadmium telluride substrate.

8 Claims, 1 Drawing Figure

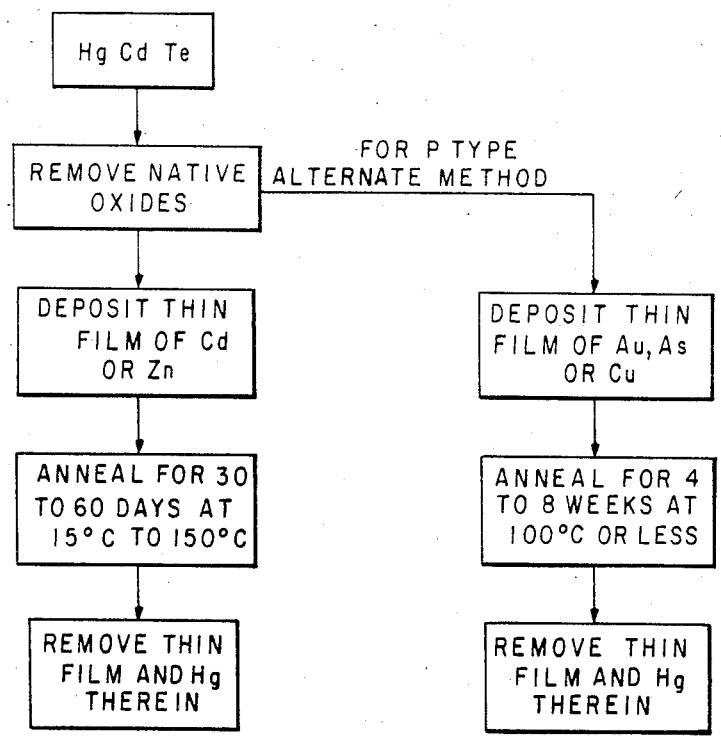

METHOD FOR PRODUCING GRADED BAND GAP MERCURY CADMIUM TELLURIDE

BACKGROUND OF THE INVENTION

1. Field of the Invention

This invention relates a method of forming substrates and wafers of mercury cadmium telluride and to a method of forming narrow band gap substrates and wafers of mercury cadmium telluride wherein the band gap gradually increases in the region of the substrate or wafer surface.

2. Brief Description of the Prior Art

Mercury cadmium telluride substrates and wafers of the prior are formed wherein the mercury appears in an amount $(1-x)$ and the cadmium appears in an amount x. Such substrates and wafers normally have value of x in the vicinity of about 0.2 to about 0.3. A problem that has been encountered in the devices formed in narrow band gap materials $(x=0.2)$ is tunneling from the interface states due to the formation of oxide films or surface damage prior to device fabrication or the deposition of other insulating layers on the semiconductor surface. This problem can be mitigated in the prior art by increasing the band gap at the wafer or substrate surface from $x=0.2$ to $x=0.3$ or higher. Prior art techniques that have been used to perform this function are solidification techniques, growing of epitaxial films of different compositions directly on the surface of the substrate from tellurium-rich melts or mercury-rich melts and the like. These prior art methods have been relatively cumbersome and expensive and it is therefore desirable to provide a more efficient and/or less costly procedure for providing a graded increase in band gap toward the surface of the mercury cadmium telluride substrate or wafer.

SUMMARY OF THE INVENTION

In accordance with the present invention, the above noted problem of the prior art is minimized and there is provided a mercury cadmium telluride substrate or wafer with graded increase in the surface band gap wherein a relatively simple and inexpensive procedure is utilized. Briefly, in accordance with the present invention, mercury is removed at the surface of the substrate or wafer, or, alternatively, mercury is replaced at the surface of the substrate or wafer with another group IIB element such as cadmium or zinc, both of which increase the band gap of the material. This is accomplished by cleaning the surface of the mercury cadmium telluride substrate or wafer to remove all native oxide and then depositing thereon a thin film of cadmium or zinc by a clean technique which does not incorporate oxygen. The substrate or wafer with deposited cadmium or zinc layer thereon is then annealed at a low temperature for about 30 to 60 days to cause a replacement of some of the mercury existing at the surface of the substrate or wafer with the cadmium or zinc, depending upon which of these materials is used. The annealing temperature is based upon the material used and is always such as to prevent a liquid from forming. For a cadmium film, annealing will take place preferably at about 150° C. The mercury replacement takes place on a graded basis with more replacement taking place at the surface and with less replacement deeper into the material. The layer of zinc or cadmium and the mercury from the surface of the substrate is then removed by etching to provide the final substrate with a graduated increased surface band gap at the substrate surface.

As an alternative, in the event a P-type substrate or wafer is desired, group I materials such as gold, silver, or copper can be utilized to extract the mercury from the surface regions of the substrate or wafer. In this embodiment, the surface of the mercury cadmium telluride substrate or wafer is cleaned to remove all native oxide and the gold, silver or copper is then deposited in a thin layer on the surface of the substrate or wafer. The substrate or wafer with the layer of gold, silver or copper thereon is then annealed in a low temperature anneal up to about 100 degrees C. for about 4 to 8 weeks. The gold, silver or copper with mercury therein is then removed by a suitable method sauch as etching or polishing to provide the final substrate or wafer with an increased surface band gap.

If desired, the thin metallization layer which is deposited for removal of mercury as explained hereinabove can be selectively deposited and patterned if it is desired to achieve a very localized change in material properties without affecting the bulk of the mercury cadmium telluride itself.

BRIEF DESCRIPTION OF THE DRAWING

The drawing is a schematic diagram showing the process steps for two of the procedures in accordance with the present invention.

DESCRIPTION OF THE PREFERRED EMBODIMENT

Referring now to the drawing, there are shown two methods for producing a mercury cadmium telluride substrate or wafer having a graduated band gap at the surface which is wider than that within the bulk of the material itself, the alternate method described being available only for P-type substrates.

Initially, a mercury cadmium telluride wafer or substrate is provided which has a narrow band gap with a value of x in the region of 0.2 to 0.3. In accordance with the first embodiment, where either an N-type or P-type substrate is involved, the native oxides on the surface of the substrate are removed by utilizing an etchant for removing such oxides such as bromine methanol etchant or anodization and lactic removal of the anodic oxide formed. A thin film of cadmium or zinc is then deposited on a surface of the substrate by a technique which does not incorporate the use of oxygen such as a vaccum deposition procedure like evaporation. This provides a diffusion couple, this diffusion couple being subjected to low temperature annealling in the region of about room temperature to about 150 degrees C. for about 30 to 60 days. Increased periods of annealling will increase the depths from which mercury will be removed. Mercury is removed from the surface regions of the substrate in a graduated manner with the larger amount being removed in the direction of the surface. The zinc or cadmium, depending upon which material is used, can then move into the substrate to replace the mercury which was removed. The mercury that has been removed will travel into the thin film of cadmium or zinc that was formed. In this way, stoichiometry can be maintained. The thin film of cadmium or zinc with the mercury therein is then etched away utilizing a simple acid such as HCl or $HNO_3$, none of the simple acids attacking mercury cadmium telluride. The cadmium or zinc layer with mercury therein is thus removed, leaving a mercury cadmium telluride substrate having increased surface band gap as desired.

As an alternative method utilizable only for P-type substrates, after removal of the native oxides, a thin layer (how thin) of gold, silver or copper is deposited on the cleaned mercury cadmium telluride substrate and then annealled for a period of from about 4 to 8 weeks at the temperature of 100 degrees or less. Mercury from the surface will now travel in a graduated manner as in the first embodiment into the deposited thin film during the annealling procedure and then will be removed by etching with a simple etchant such as HCl or $HNO_3$ or by physical removal as with an adhesive tape. The resulting substrate is the same as that produced in accordance with the first embodiment.

It should be understood that in the case of either of the embodiments described hereinabove, the deposition of the thin film can be accomplished using a patterned procedure to achieve a very localized change in material properties without affecting the bulk mercury cadmium telluride material itself.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. A method of providing substrates of mercury cadmium telluride with graded bandgap at the surface region thereof, comprising the steps of:
   (a) providing a substrate of mercury cadmium telluride,
   (b) depositing a thin film of a material taken from the class consisting of cadmium and zinc on a surface of said substrate,
   (c) annealling said substrate with the film thereon for a period sufficient to cause a predetermined amount of mercury to travel from said substrate into said film, and
   (d) removing the thin film with the mercury therein.

2. A method as set forth in claim 1 wherein said substrate has the composition $Hg_{1-x}Cd_xTe$, where x is from about 0.2 to about 0.3.

3. A method as set forth in claim 1 wherein said annealling step is carried out at a temperature in the range of about room temperature to about 150° C. for from about 30 days to about 60 days.

4. A method as set forth in claim 2 wherein said annealling step is carried out at a temperature in the range of about room temperature to about 150° C. for from about 30 days to about 60 days.

5. A method of providing substrates of mercury cadmium telluride with graded band gap at the surface region thereof, comprising the steps of:
   (a) providing a P-type substrate of mercury cadmium telluride,
   (b) depositing a thin film of a material taken from the class consisting of gold, silver and copper on a surface of said substrate,
   (c) annealling said substrate with the film thereon for a period sufficient to cause a predetermined amount of mercury to travel from said substrate into said film, and
   (d) removing the thin film with the mercury therein.

6. A method as set forth in claim 5 wherein said substrate has the composition $Hg_{1-x}Cd_xTe$, where x is from about 0.2 to about 0.3.

7. A method as set forth in claim 5 wherein said annealling step is carried out at a temperature in the range of from about room temperature to about 100° C. for from about 4 weeks to about 8 weeks.

8. A method as set forth in claim 6 wherein said annealling step is carried out at a temperature in the range of from about room temperature to about 100° C. for from about 4 weeks to about 8 weeks.

* * * * *